United States Patent [19]

Hughes

[11] 4,308,619
[45] Dec. 29, 1981

[54] APPARATUS AND METHODS FOR SYNCHRONIZING A DIGITAL RECEIVER

[75] Inventor: William C. Hughes, Scotia, N.Y.

[73] Assignee: General Electric Company, Schenectady, N.Y.

[21] Appl. No.: 106,453

[22] Filed: Dec. 26, 1979

[51] Int. Cl.³ .............................................. H03B 3/06
[52] U.S. Cl. .............................. 375/119; 340/310 A; 328/155
[58] Field of Search .................... 375/8, 9, 106, 110, 375/118, 119, 120; 455/257, 258, 260, 265; 340/171 R, 310 A, 310 R; 328/58, 133, 155; 331/1 A, 14, 19; 329/122, 124

[56] References Cited

U.S. PATENT DOCUMENTS

| 3,731,219 | 5/1973 | Mader et al. ........................... 331/14 |
| 3,944,723 | 3/1976 | Fong ...................................... 178/3 |
| 3,973,087 | 8/1976 | Fong .............................. 179/170 R |
| 3,973,240 | 8/1976 | Fong .................................. 340/151 |
| 4,032,858 | 6/1977 | Hargis .................................. 331/14 |
| 4,109,204 | 8/1978 | Kincaid .......................... 340/310 R |
| 4,119,926 | 10/1978 | Frosch ................................. 331/14 |
| 4,135,181 | 1/1979 | Bogacki et al. ................. 340/310 A |
| 4,161,720 | 7/1979 | Bogacki ............................. 340/150 |

Primary Examiner—Benedict V. Safourek
Attorney, Agent, or Firm—Geoffrey H. Krauss; James C. Davis; Marvin Snyder

[57] ABSTRACT

Apparatus for synchronizing the bit clock in a digital receiver to be in phase with bits of a received data stream, utilizes a frequency source locked to a system-wide frequency and frequency-arithmetic means for providing first and second local frequencies respectively slightly greater and slightly less than a multiple of the system-wide frequency. Countdown circuitry provides a multiplicity of local clock phases at the local clock frequency for phase comparison with the clock frequency derived from the received data stream and for subsequent digital phase adjustment to cause the local baud clock to track the received data stream bit transition frequency.

29 Claims, 4 Drawing Figures

APPARATUS AND METHODS FOR SYNCHRONIZING A DIGITAL RECEIVER

BACKGROUND OF THE INVENTION

The present disclosure concerns digital communications systems and, more particularly, apparatus for synchronizing a bit clock in a digital receiver to be in phase with data bits of a received data stream.

In digital communication systems, a clock is often required at the digital data receiver to indicate the start and completion times of each data bit time interval. This clock must be of proper phase with respect to the received signal and is usually so phased by reference to a selected characteristic of the received signal itself. Typical systems using a powerline transmission medium are disclosed and claimed in U.S. Pat. No. 3,973,240, issued Aug. 3, 1976; U.S. Pat. No. 3,973,087, issued Aug. 3, 1976; U.S. Pat. No. 3,944,723, issued Mar. 16, 1976; U.S. Pat. No. 4,135,181, issued Jan. 16, 1979; and U.S. Pat. No. 4,161,720, issued July 17, 1979, all assigned to the assignee of the present application and all incorporated herein by reference in their entirety.

When the received signal is particularly rich in data transitions, one typical approach is to detect such data transitions and lock a phase-lock loop to the data transitions to achieve synchronism. It is not always possible to employ an optimum data detection scheme, whereby the input to a phase-locked loop will be relatively noisy and the loop may not achieve the desired synchronism with the incoming data bits stream. The deleterious effects of input noise may be reduced by increasing the phase-lock loop time constant, whereby many data cycles are averaged. Advantageously, as many data bit transitions as possible should occur in the data stream for a long-time-constant phase-locked loop to attain maximum advantage; systems utilizing such a synchronizing scheme will typically also utilize data coding schemes which deliberately introduce data transitions so that the maximum number of data transmissions occur for any bit stream.

However, in digital communication systems which transmit relatively long strings of data bits without transitions, and/or have a signal-to-noise ratio which is relatively low, the required phase-locked loop time constant would become so great that a loop many not be designable which will pull into phase-lock. Similarly, if relatively low frequencies are utilized, the required long time constants may become difficult, if not impossible, to physically realize. Thus, a means for phasing a local, or data bit, clock in a digital receiver to be in phase with the data bits of a received data stream, without requiring unusually long time constants, is desirable.

Brief Summary of the Invention

In accordance with the invention, apparatus for synchronizing the local data bit clock in digital receiver to be in-phase with the received data bit stream includes circuitry for providing a locally generated master clock frequency which is an accurate multiple of the transmitted bit clock; frequency-adder and frequency-subtractor means act upon the master frequency to generate two local frequencies slightly greater and slightly smaller than a submultiple of the local clock frequency. Switching circuitry is utilized to introduce, at any particular time, a selected one of: a submultiple of the master frequency; the local frequency slightly greater than the master frequency submultiple; or the local frequency slightly smaller than the master frequency submultiple, to a Johnson counter. The counter provides N different phases of a local clock frequency substantially at the data bit stream clock frequency. The local clock frequency waveform and the detected received data are digitally multiplied in a phase detector, and the output of the phase detector is utilized to control the switching of the higher or lower local frequency to the counter, to cause incoming data bit transitions to be kept centered within a half-cycle of the locally-generated clock waveform.

In one presently preferred embodiment of the present invention, the master frequency is connected to the counter to maintain the correct phase of the local clock during extended periods of time when a data bit stream is not being received, such as when data transmission from the apparatus is taking place.

Accordingly, it is an object of the present invention to provide novel apparatus for synchronizing the local bit clock in a digital receiver to be in-phase with a received data bit stream.

It is another object of the present invention to provide novel methods for synchronizing the local bit clock in a digital receiver to be in-phase with a received data bit stream.

These and other objects of the present invention will become apparent upon consideration of the following detailed description, when taken in conjunction with the drawings.

BRIEF DESCRIPTION OF THE DRAWINGS

FIG 1b is a schematic diagram of an alternative phase detector for use in the apparatus of FIG. 1a.

DETAILED DESCRIPTION OF THE INVENTION

Figure 1:
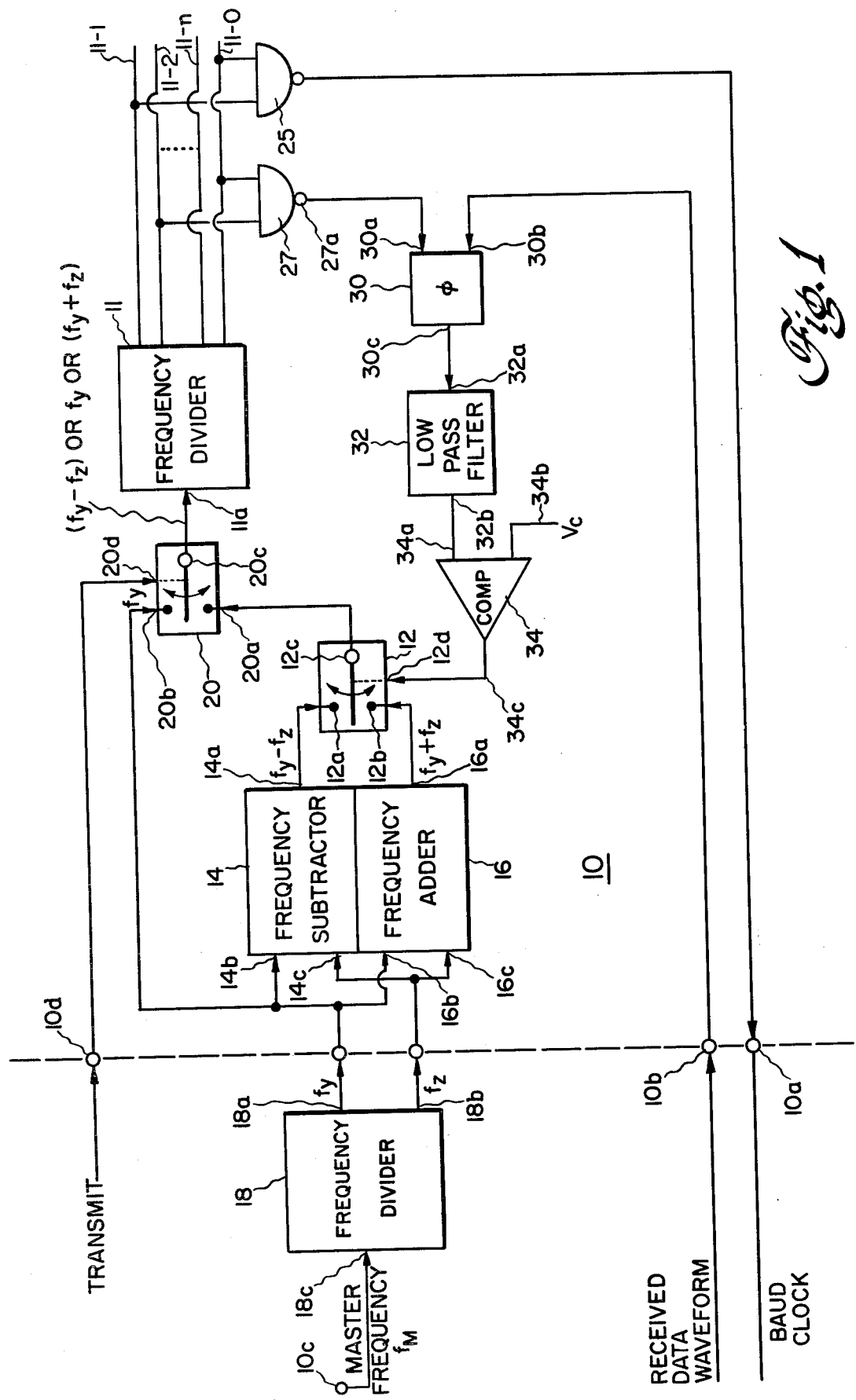
FIG. 1 is a block diagram of a novel digital receiver clock synchronizer in accordance with the principles of the present invention.

Referring initially to FIG. 1, apparatus 10 synchronizes a local clock, herein referred to as a Baud Clock (available at apparatus output terminal 10a) to the data bit transition frequency (herein the reference frequency, made available at input terminal 10b) of the received data bit stream. A signal at a master frequency $f_M$ is provided by other receiver circuitry (not shown) at another apparatus input 10c. The frequency $f_M$ of this locally-generated (i.e. in the data receiver) master frequency clock signal is an accurate multiple of the transmitted bit clock frequency. For example, in a powerline communications system, wherein data is transmitted over the commercial power distribution network, the baud rates and bit time intervals are all referenced to the prevailing powerline frequency, e.g. nominaly 60 Hz. in the United States. For various reasons described in the above-listed U.S. Patents, the various frequencies utilized in such a system are exact multiples of the prevailing powerline frequency, which may vary over the range of 59.9 Hz. to 60.1 Hz.. For purposes of illustration, the master frequency clock signal is provided at a frequency $f_M$ of 983,040 Hz. $= 16,384 \times 60$ Hz. = $60 \times 2^{14}$ Hz.. This master frequency signal, locked to the powerline signal frequency, may be provided by circuitry such as is disclosed and claimed in co-pending U.S. Patent application Ser. No. 103,032, filed Dec. 13, 1979 or by other frequency-generating apparatus known to the art.

A frequency divider 11 is, at any particular instant, provided with one of a pair of signals centered around a first frequency $f_y$ which is a submultiple of master clock frequency $f_M$, e.g. $f_y = 2^M \times f_b$, where $f_b$ is the data stream baud frequency. The first local frequency signal is at a frequency $(f_y - f_z)$, where $f_z$ is an offset frequency. The first local frequency signal is provided to one selectable terminal 12a of a electronically-actuatable switch means 12 from the output 14a of a frequency subtractor means 14. Subtractor means 14 has a first input 14b receiving a signal at the center frequency $f_y$ and a second input 14c receiving the offset frequency $f_z$ signal. The second local frequency $(f_y + f_z)$ is slightly greater than the center frequency $f_y$ and is provided to another selectable terminal 12b of switch means 12 from the output 16a of a frequency adder means 16. A first input 16b of adder means 16 receives the center frequency $f_y$ signal and the offset frequency $f_z$ signal is received at another input 16c. The center and offset frequency signals are provided at first and second outputs 18a and 18b, respectively, of a frequency divider means 18, having an input 18c receiving the master clock frequency $f_y$ signal from input terminal 10c.

The single-pole, double-throw switch means 12, which may be any mechanical, electronic, electromechanical and the like switching means of suitable configuration, has its common terminal 12c coupled to one selectable terminal 20a of another single-pole, double-throw switch means 20, having its remaining selectable terminal 20b receiving the center frequency $f_y$ signal from output 18a of the frequency divider. Common second switching means terminal 20c is connected to the input 11a of frequency divider 11. The actuation input 20d of second switch means 20 is connected to another apparatus input terminal 10d at which a signal is present during such times as data is transmitted from the location at which the receiver is located, and which "transmit" signal operates switches means 20 from its normally-closed position in which terminals 20a and 20c are connected, to close a path between selectable terminal 20b and common terminal 20c.

Frequency divider 11 includes a Johnson counter having N outputs 11-1 to 11-n, at which are provided N different phases of a subharmonic of the frequency of the signal provided at frequency divider means input 11a. Frequency divider means 11 also provides a gating output 11-o. The gating output and a selected one of the N phase output lines are each coupled to a different input of a first two-input NAND gate 25, having its output coupled to apparatus terminal 10a for providing the baud clock signal synchronized to the received data bit stream transition (clock) frequency. A second two-input NAND gate 27 has one input coupled to gate output 11-o and a second input connected to a selected one of the N phase output lines to provide a signal at an output 27a of the gate for introduction into one input 30a of a phase detecting means 30. The remaining input 30b of the phase detecting means receives the data bit stream from apparatus output 10b. A phase detector output 30c is connected to the input 32a of a low pass filter means 32. The output 32b of the lowpass filter means is connected to one inputed 34a of a comparator means 34, having its remaining input 34b receiving a voltage of constant magnitude $V_c$. The comparator output 34c is connected to the first switching means actuator input 12d to cause first switching means common terminal 12c to be connected to frequency subtractor output 14a or to frequency adder output 16a if the voltage at comparator input 34a is, respectively, greater than, or less than, the reference comparator voltage $V_c$ at second comparator input 34b.

In operation, the local clock waveform at NAND gate output 27a is compared to the transitions of the received data bit stream; if the received data bit transitions do not occur exactly in the center of a half-cyle of the locally generated local clock waveform (present at phase detector input 30a), a D.C. voltage is present at the phase detector output 30c and, after filtering in low pass filter means 32, at comparator first input 34a. The D.C. voltage increases, due to the error in frequency between the signals at phase detector inputs 30a and 30b, and causes the signal level at comparator output 34c to switch, operating first switch means 12 to connect the remaining local frequency (which will be a frequency less than the local center frequency if switch means 12 originally connected the local frequency greater than the local center frequency to frequency divider 11, and vice versa). If, for example, switch means 12 is operated to connect common contact 12c to selectable contact 12b, whereby the higher local frequency $(f_y + f_z)$ signal is connected to frequency divider 11, first phase detector input 30a is receiving a slightly higher frequency signal than the frequency of the signal received at second phase detector input 30b. The frequency-phase difference gradually increases the detected phase error whereby the phase detector output 30c has a gradually changing, illustratively increasing, magnitude D.C. signal thereat. After filtering, the comparator first input 34a voltage gradually increases until the magnitude of the comparator reference voltage $V_c$, at comparator reference voltage $V_c$, at comparator second input 34b, is exceeded, whereby comparator output 34c changes state and causes switch means 20 to reconnect common contact 12c to selectable contact 12a, whereby the lower local frequency $(f_y - f_z)$ signal is coupled to the frequency divider. The frequency of the signal at first phase detector input 30a is now less than the received bit stream transition frequency at second phase detector input 30b, whereby the voltage at comparator first input 34a now decreases until the first input voltage becomes less than the second input reference voltage, whereupon the output 34c voltage changes state and again causes switch means 12 to reconnect common contact 12c to selectable contact 12b and input the upper local frequency signal to frequency divider 11. Thus, the error between the local clock (baud clock) frequency and the received data frequency will decrease. The system is a type zero servo-mechanism which will seek and then "hunt" around the correct frequency/phase relationship to lock the baud clock frequency to the received data transition frequency. If the receiver is turned off for any reason, such as to allow transmission of data from the receiver location by means of a separate transmitter (not shown), the correct nominal frequency (local center frequency $f_y$) is switched into frequency divider means 11 by actuation of switch means 20.

Figure 1A:
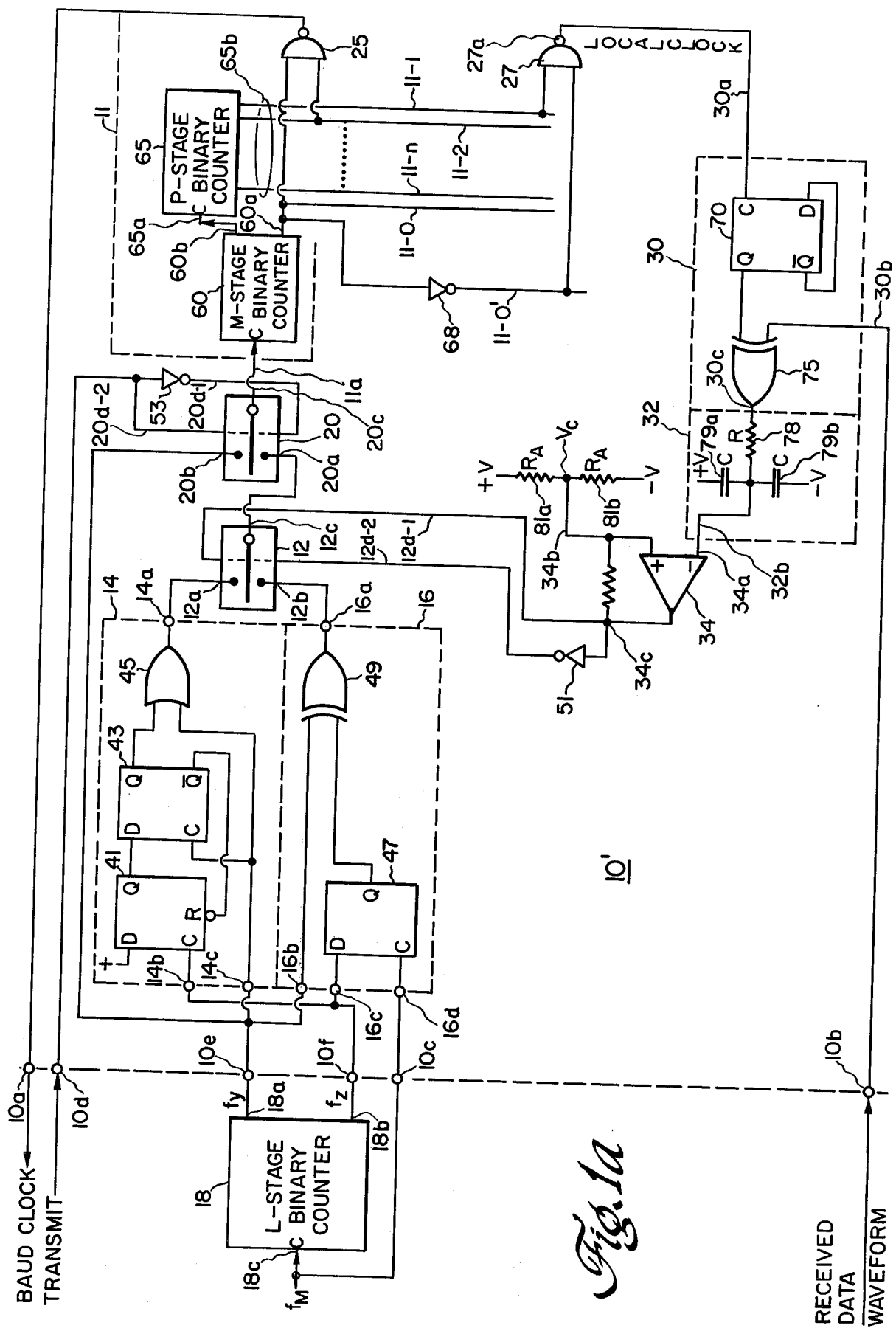
FIG. 1a is a schematic diagram of one presently preferred implementation of the synchronizing apparatus of FIG. 1.
Figure 16:
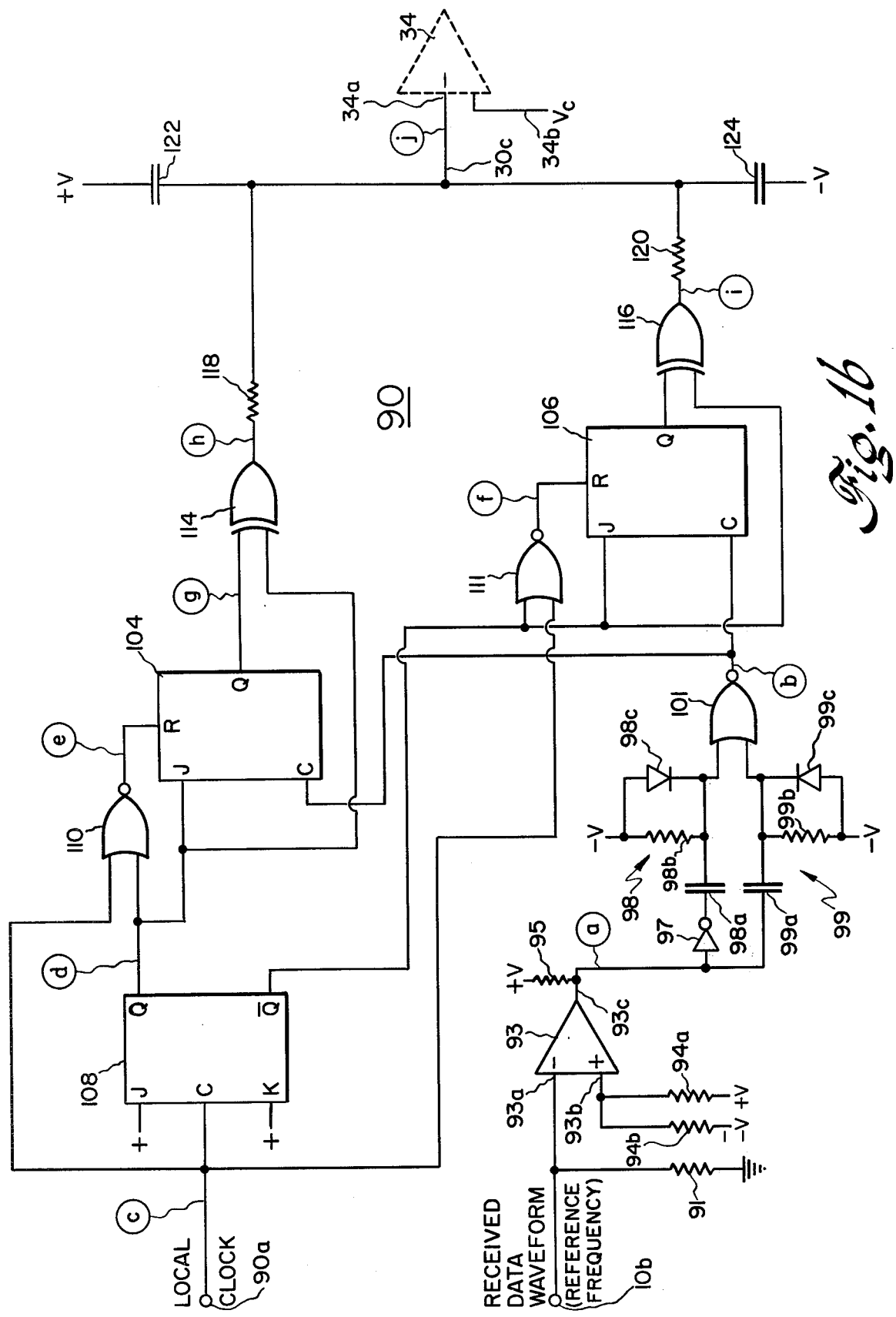

Referring now to FIG. 1a, a particular implementation of apparatus 10 for the aforementioned powerline communication system is illustrated. In the implementation of FIG. 1a, the master frequency $f_M$, at input 10c, is nominally 983,040 cycles, which is $2^{14}$ (or 16,384) times the nominal 60 Hz. powerline frequency and is $2 \times 3^L \times f_b$. It should be understood that, as master frequency $f_M$ is exactly $2^{14}$ times the instantaneous powerline frequency, the master frequency will be between $2^{14} \times 59.9$ Hz.=981,401.6 Hz. and $2^{14} \times 60.1$ Hz.=984,678.4 Hz. The nominal frequencies will, however, be used herein, for purposes of clarity. Frequency divider 18 is a L-stage counter having L individual outputs each coupled to a different one of the counting stages. In the illustrated embodiment, counter 18 is a binary ripple counter with L=14, such as may be provided by a CMOS 4024 integrated circuit. The local center frequency $f_y$ signal at output 18a is taken from the output of the first divider stage, with $L_c = 1$, to provide a signal of frequency $f_y$ of $(983,040 \div 2^{Lc} = 983,040 \div 2^1 =) 491,520$ Hz. The local offset frequency $f_z$ signal at frequency divider means output 18b is taken from the output of the tenth binary counter stage ($L_o = 10$) to provide a signal with local offset frequency $f_z$ of $(983,040 \div 2^{Lo} = 983,040 \div 2^{10} =) 960$ Hz. If the master frequency $f_M$, local center frequency $f_y$ and local offset frequency $f_z$ signals are otherwise available within other portions of the digital communication system receiver, as would be the case if the crystal-oscillator-stabilized phase-locked loop of the aforementioned co-pending application Ser. No. 103,032 is utilized for other purposes within the receiver, frequency divider 18 need not be duplicated in the baud clock synchronizing apparatus 10', and the synchronizing apparatus inputs 10c, 10e and 10f will respectively receive substantially squarewave signals respectively at the master frequency, local center frequency and local offset frequency.

Frequency subtractor 14 comprises a pair of D-type flip-flop logic elements 41 and 43 and a NOR gate 45. The clock C input of first flip-flop logic element 41 is connected to the subtracted-frequency input 14b, receiving the offset frequency $f_z$ signal. The data D input of first flip-flop element 41 is connected to a positive logic level source. The Q output of flip-flop element 41 is connected to the data D input of second flip-flop element 43. The clock C input of second flip-flop element 43 is connected in parallel with one of the inputs of NOR gate 45, to the first frequency subtractor input 14c, receiving the local center frequency $f_y$ signal. The remaining input of NOR gate 45 is connected to the Q output of second flip-flop flop element 43, while the inverted $\bar{Q}$ output of second flip-flop element 43 is connected back to the reset R input of first flip-flop element 41. The output of NOR gate 45 is the frequency subtractor means output 14a. Frequency subtractor 14 functions by removing the number of input waveform transitions of the signal at the frequency-subtracted input 14b from the number of transitions of the waveform at first input 14c. Thus, the local frequency at frequency subtractor means output 14a is $(f_y - f_z)$.

Frequency adder means 16 comprises a flip-flop logic element 47 and a two-input exclusive-OR gate 49. The clock C input of the D-type flip-flop element 47 is connected to a clock input 16d of the frequency adder means for reception of the master frequency $f_M$ signal at master frequency terminal 10c. The data D input of flip-flop element 47 is connected to second frequency adder means input 16c to receive the local offset frequency $f_z$ signal, and the Q output of flip-flop element 47 is connected to one input of exclusive-OR gate 49. The remaining input of exclusive-OR gate 49 is connected to frequency adder means first input 16b to receive the local center frequency $f_y$ waveform. The output of exclusive-OR gate 49 is the frequency adder means output 16a. The exclusive-OR gate 49 provides an output transition for each transition at either of the inputs thereto. The input transitions occur for each transition of the local center frequency $f_y$ waveform and for the local offset frequency $f_z$ waveform. The master frequency $f_M$ waveform is utilized as the clock input to flip-flop element 47 to assure that offset frequency transitions at the Q output of flip-flop 47 do not occur at exactly the same time as local center frequency $f_y$ transitions from input 16b to exclusive-OR gate 49. Thus, the waveform at frequency adder means output 16a has a frequency $(f_y + f_z)$ which is the sum of the transitions of the two input frequencies.

First and second switching means 12 and 20, respectively, are solid-state switches (such as are available in CMOS 4066 integrated circuits) and have separate inputs 12d-1 and 12d-2 or 20d-1 and 10d-2, respectively, for controlling connection of respective common terminals 12c and 20c, respectively, to first selectable terminals 12a and 20a, respectively, or second selectable terminals 12b and 20b, respectively, when energized. Accordingly, a first inverter 51 is utilized with its input connected to first switching means first selector input 12d-1 and its output connected to first switching means second selectorinput 12d-2, while another inverter 53 is utilized with its output connected to second switch means first selector input 20d-1 and its input connected to the second switch means second selector input 20d-2 and to the transmit input 10d of apparatus 10'. Thus, in the absence of a transmit signal, second switching means second selector input 20d-2 is not energized, while inverter 53 causes second switching means first selector input 20d-1 to be energized to cause second switching means first selectable terminal 20a to be connected to second switching means common terminal 20c, and to the frequency divider input 11a. Similiarly, when the voltage at comparator output 34c is low, first switching means first selector input 12d-1 is not energized, while inverter 51 causes first switching means second selector input 12d-2 to be energized, coupling first switching means selectable terminal 12b to first switching means common terminal 12c and second switching means first selectable terminal 20a.

Frequency divider means 11 comprises a M-stage counter means 60 having its count C input connected to divider means input 11a and having, in the illustrated embodiment wherein counter 60 is a M=14 stage binary ripple counter, M=14 individual outputs available. A first output 60a forms the gating signal output 11-o of frequency divider means 11, and is taken, in the illustrative example, from the output of the M=14 stage. The substantially square waveform signal at output 60a has a frequency equal to the nominal (local) frequency $f_y \div 2^{14}$ (or 16384), i.e. nominally 30 Hz. A second binary counter output 60b, is taken from the tenth ripple counter stage output, with M=10, to provide a substantially square waveform signal with a frequency equal to the local center frequency $f_y \div 2^{10}$ (=1024), i.e. nominally 480 Hz. The second output 60b is connected to the input 65a of a P-stage Johson counter 65, such as may be provided by a CMOS 4022 integrated circuit, which has P=8 stages to provide 8 outputs 65b each having a different one of P=8 phases of the output frequency waveform, which is equal to the frequency of the waveform at input 65a divided by the number P of counter stages. In the illustrative example, wherein P=8, outputs 65b provide 8 phases of a 60 Hz. signal, having equal phase differences between each adjacent pair of the outputs. Outputs 65b form the multiple phase outputs 11-1 through 11-n of frequency divider means 11. An inverter 68 has its input coupled to gate output 11-o to provide an inverted gate output signal on line 11-o', as may be necessary for coupling to one of gates 25 and/or 27, for properly gating a desired one of the multiple phase output signals on lines 11-1 through 11-n to form the baud (data bit transition) clock signal in gate 25 for coupling to baud clock output 10a, and to form the local clock signal at the output 27a of NAND gate 27. Thus, one of 16 phases can be selected for baud clock 10a by selecting one input for NAND gate 25 from the signals on lines 11-1 to 11-n and the other input from the signals on lines 11-o or 11-o'.

Phase detector 30 requires a flip-flop logic element 70 having its clock C input receiving the local clock signal at phase detector first input 30a, with a data D input wired back to an inverted Q output, and having a Q output connected to one input of a two-input exclusive-OR gate 75. The remaining input of exclusive-OR gate 75 forms the second input 30b of the phase detector, receiving the received data bit stream transition frequency signal at apparatus input 10b. Flip-flop element 70 serves to divide the local clock frequency by two to have the same frequency (e.g. 15 Hz.) as the data bit stream transition frequency at phase detector second input 30b. Exclusive-OR gate 75 functions, in known manner, as a phase detector providing a signal of D.C. average magnitude related to the phase difference between the signals at the exclusive-OR gate inputs.

Low-pass filter means 32 comprises a series resistance 78 of resistance magnitude R and a pair of filter capacitors 79a and 79b, of capacitance magnitude C, respectively connected between one of positive and negative supply potentials (+V and −V) and the end of the resistance 78 furthest from phase detector 75. The junction between capacitances 79a and 79b and resistance 78 forms the low pass filter means output 32b, connected to the inverting input 34a of an operational amplifier forming comparator 34. The non-inverting input 34b of the operational amplifier receives the threshold voltage $V_c$ at the junction between a pair of resistance elements 81a and 81b, which may have substantially identical resistances $R_A$, and respectively connected in series between the positive and negative operating potential supplies. A feedback resistor 82 is connected between the non-inverting input and the output of the operational amplifier. The operational amplifier output 34c connects to first switch means first selector input 12d-1 and the input of first inverter 51.

One of the master frequency, higher local frequency and lower local frequency signals is always switched into the count C input of counter 60 and is counted down through counters 60 and 65 to provide frequencies nominally at 480 Hz. (at the input to Johnson counter 65) and 240 Hz. (on gateline 11-o and inverted gateline 11-o'). The Johnson counter provides P phases of a frequency signal which is twice the baud clock frequency, e.g. nominally at 30 Hz. One of the clock phases is selected for connection to gate 27 which rejects every other output pulse from the selected counter output 65b waveform, to produce a properly phased 30 Hz. clock frequency waveform. This waveform frequency is further divided by two in flip-flop logic element 70 and then multiplied by the detected received data waveform (having a nominal frequency of 15 Hz.) which appears as the received data frequency at apparatus input 10b. The output of the phase detector is filtered in low-pass filter means 32 and is applied to level detector 34 to cause one of the higher or lower local frequency waveforms to be coupled to frequency divider 11. If the transitions of the received data do not occur exactly in the center of a half cycle of a local clock waveform, after division by two in flip-flop element 70, the phase detector causes a D.C. voltage to build up in the filter causing the comparator output to switch the frequency divider means 11 input frequency to that one of the higher and lower local frequencies which will cause the error to be decreased, resulting in a type zero servomechanism, as hereinabove explained. When the receiver is turned off, the transmit input 10d is energized, connecting the master frequency input directly to frequency divider 11 to maintain a reference phase over an extended period of time, until the transmission is complete and control of the baud clock synchronizing apparatus is again returned to the reference frequency input 10b. The phase detector error time constant is, it should be understood, controlled by the particular phase spacing available at counter outputs 65b, and thus established by the frequency (e.g. 480 Hz.) at the input 65a of the P-stage counter. By selecting the offset frequency $f_z$ (which is equal to the P-stage counter input frequency) the error detection time constant can be easily adjusted.

Synchronizing apparatus 10' will, if an exclusive-OR gate 75 is utilized as a phase detector, lock-in on a particular positive or negative half-cycle of the clock (at the 15 Hz. clock frequency and dependent upon the polarity of the local clock signal at phase detector input 30a). It may, therefore, slip a cycle if there is data on the data received signal; slippage is not desirable. An alternative presently preferred phase detector-lowpass filter means 90 (replacing phase detector 30 and lowpass filter means 32 of FIGS. 1 and 1a) is shown in FIG. 1b. This alternative phase detector 90 has the advantage that it will lock on either half-cycle of the clock waveform and will not change its phase for any received data pattern, provided that the received data transitions are spaced near, or at, the expected bit times, e.g. 1/30th of a second apart, even if data transitions do not occur for each bit time and are, in fact, relatively sparce.

The received waveform, at synchronization apparatus input 10b, is coupled across resistance 91, between ground potential and to the inverting input 93a of an operational amplifier 93. The non-inverting input 93b of the operational amplifier receives a reference voltage provided at the junction between a pair of resistors 94a and 94b, which may be of substantially equal resistance and may be coupled in series between the positive and negative operating potentials. The operational amplifier output 93c (which may be returned to positive operating potential through a pull-up resistor 95) is connected through an inverter 97 to a first differentiation-clamping network 98, comprises of a series capacitor 98a and a paralleled resistance 98b and diode 98c, having its cathode connected to the resistor-capacitor junction and its anode connected (along with one terminal of the resistance 98b) to the negative operating potential. Operational amplifier output 93c is also connected to a second differentiation-clamping network 99 having a series capacitor 99a and a resistor 99b, with another diode 99c having its cathode connected to the resistance-capacitance junction and its anode connected (along with the remaining terminal of resistor 99b) to the negative operating potential. A two-input NOR gate 101 has one of its inputs respectively connected to the resistance-capacitance junction of each of differentiator-clamper networks 98 and 99. The output of gate 101 is connected to the count C inputs of each of a pair of JK-type flip-flop logic elements 104 and 106, respectively. The local clock signal at the output 27a of NAND gate 27 (FIG. 1a) is connected to an input 90a of the alternative phase detector circuit and is coupled to the clock C input of a third JK-type flip-flop logic element 108 and to one input of each of a pair of two-input NOR gates 110 or and 111. The JK inputs of flip-flop element 108 are connected to a positive logic potential, while the Q output of element 108 is connected in parallel to the remaining input of NOR gate 110, the J input of flip-flop logic element 104 and to one input of a two-input exclusive-OR gate 114. The $\bar{Q}$ output of flip-flop logic element 108 is connected in parallel to the remaining input of NOR gate 111, the J input of flip-flop logic element 106 and to one input of a two-input exclusive-OR gate 116. The output of NOR gate 110 is connected to a reset R input of flip-flop logic element 104, while the output of NOR gate 111 is connected to a reset R input of flip-flop logic element 106. The Q outputs of flip-flop logic elements 104 and 106, respectively, are connected to the remaining inputs of exclusive-OR gates 114 and 116, respectively. The outputs of respective gates 114 and 116 are coupled through respective filter resistances 118 and 120 to a common junction 30c. Junction 30c is the output of the phase detector-filter, to be coupled to the inverting input 34a of the operational amplifier-comparator 34. A first filter capacitor 122 is connected from junction 30c to the positive operating potential while a second filter capacitor 124, of substantially the same capacitance as the capacitance of capacitor 122, is connected between junction 30c and the negative operating potential.

Figure 1C:
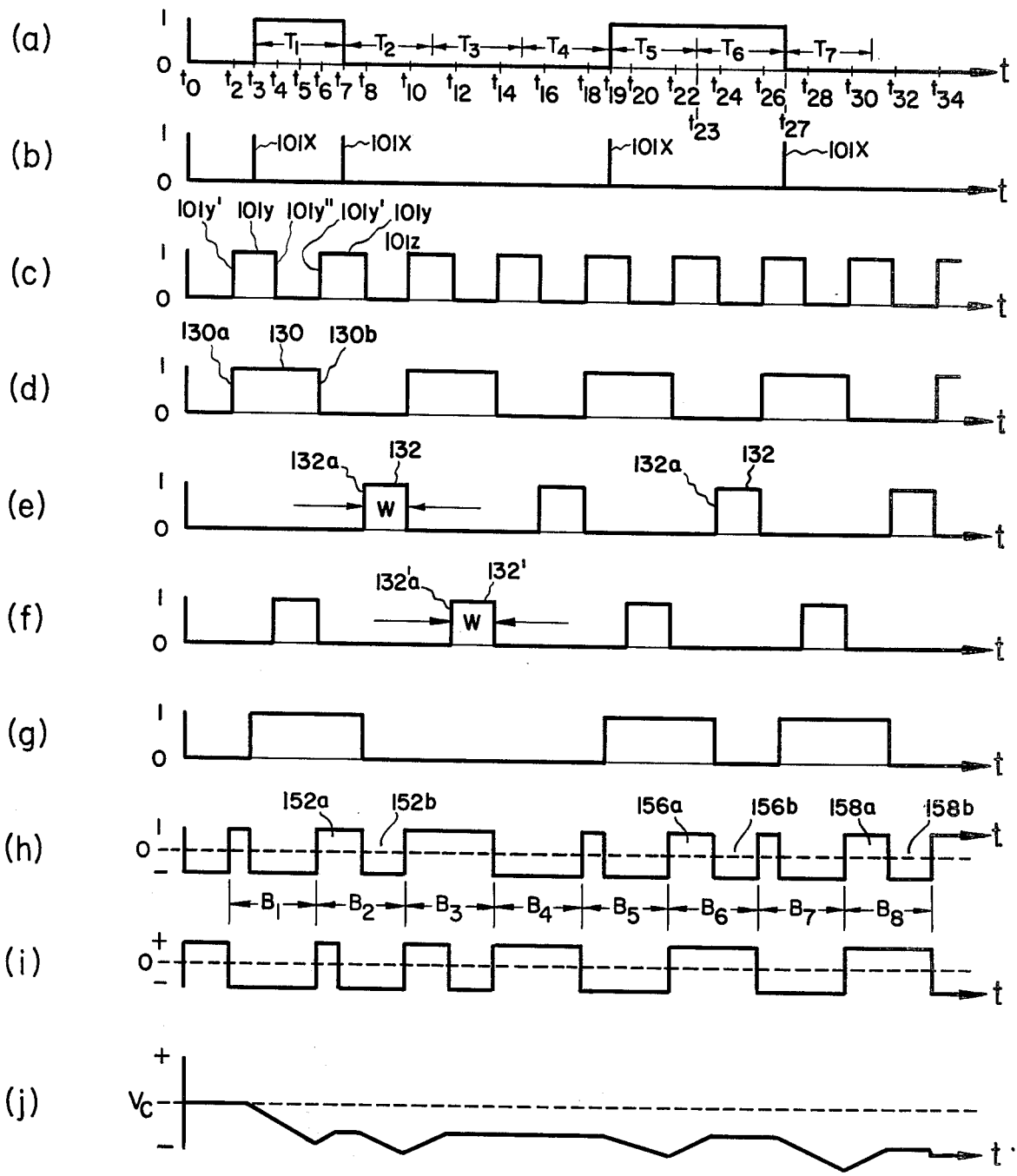
FIG. 1c is a set of inter-related waveforms found at various points in the apparatus of FIG. 1b, and useful in understanding the operation thereof.

In operation, referring to FIG. 1b and the waveforms of FIG. 1c, the received reference frequency waveform is squared up by the comparator formed by operational amplifier 93 and its associated circuitry. The squared-up received waveform (waveform a of FIG. 1c) may, illustratively, be at a logic 0 level until time $t_3$, then be at a logic one level in the data bit time interval $T_1$ between time $t_3$ and time $t_7$, again returning to a logic 0 level in the data bit time intervals $T_2$, $T_3$ until time $t_{19}$, then have a logic one level for two bit time intervals $T_5$ and $T_6$ from time $t_{19}$ to time $t_{23}$ and from time $t_{23}$ to time $t_{27}$, before returning to a logic zero level in time interval $T_7$. Thus, the received waveform has, in seven bit time intervals $T_1$–$T_7$, the binary message "1000110." After differentiation, and clamping by diodes 98c and 99c, as required, positive-going transitions appear at the output of network, 99; negative-going transitions, now inverted by inverter 97 to be positive-going transitions, appear at the output of network 98. The two sets of now-positive-going transitions are OR'd in gate 101, having an output waveform (waveform b of FIG. 1c) which is a short duration, positive-going pulse 101x at each transition of the reference input waveform, e.g. at times $t_3$, $t_7$, $t_{19}$ and $t_{27}$. This waveform is the clock for flip-flop elements 104 and 106. The local clock waveform at gate output 27c (waveform c of FIG. 1c) is a square wave having a frequency, e.g. 30 Hz., i.e. a waveform with a period equal to the minimum period (e.g. a 1/30 second) of the data transitions 101x at the output of gate 101. Detector 90 is to produce a "no-error" voltage equal to Vc (which may or may not be zero volts) only if each of the pulses 101x occur at exactly the same time as a negative-going transition 101y″ of the local clock square wave of waveform c. The magnitude of the error voltage, above or below the "no-error" voltage, is to be proportinal to the time between a pulse 101x and the nearest negative clock transition 101y″. The polarity of the error voltage, above or below the "no-error" voltage, is dependent upon whether the pulse 101x occurs during a positive interval 101y of waveform c or a negative interval 101z. In the example of FIG. 1c, the pulses 101x are shown to be occurring during positive intervals 101y of waveform c and therefore slightly leading transition 101y″. Under these conditions, the phase detctor will produce a negative (i.e. magnitude less than $V_c$) error signal.

The local clock square waveform clocks flip-flop logic element 108, whereby the Q output (waveform d of FIG. 1c) thereof is a square wave at one-half the local clock frequency, e.g. an output waveform 130 at a 15 Hz. frequency, having rising and falling edges 130a and 130b synchronous with the rising edges 101y′ of the local clock signal (waveform c). The Q output (waveform d) is logic NOR'd in gate 110 with the local clock (waveform c) and the output of gate 110 is waveform e of FIG. 1c, having a logic 1 level only when the logic levels of the clock and flip-flop element 108 Q output waveforms are both logic zeros, e.g. pulses 132 having a frequency equal to one-half the local clock frequency (15 Hz.) and having a width W of one-quarter of the total time interval between leading edges of successive pulses 132. Similarly, as NOR gate 111 receives the local clock waveform (waveform c) and the $\bar{Q}$ output waveform (being the inverse of the Q output waveform d), the output signal of gate 111 is a waveform (waveform f of FIG. 1c) similar to waveform e at the gate 110 output, but shifted in phase by 180°. Thus, waveform f is a train of pulses 132′, also having width W equal to one-quarter of the total time interval between pulses 132′, but having the leading edge 132a′ delayed by half a time interval from the leading edge 132a of the gate 110 pulse train. Flip-flop logic element 104 is connected so that the Q output (waveform g of FIG. 1c) goes positive if a transition of the gate 101 output occurs when the clock input of the flip-flop element is positive. Thus, the Q output of flip-flop element 104 goes positive at time $t_3$, when a gate 101 output phase pulse 101x occurs, and stays positive until reset by the leading edge 132a of the gate 110 output waveform e, at time $t_8$. Similarly, output waveform g also goes positive at time $t_{19}$, due to a pulse 101 at the clock C input and stays positive until reset at time $t_{24}$, by a pulse 132 leading edge 132a and also goes positive at time $t_{27}$ and is reset at time $t_{32}$. The resetting of the flip-flop logic element 104 thus occurs at the center of the next half-cycle of waveform d, at one-half the local clock frequency. The action of exclusive-OR gate 114 is such that, if a transition of the output of gate 101 (waveform b) occurs during a time when the Q output of flip-flop element 108 is positive, the output of gate 114 (waveform h) will have a negative D.C. component, for that clock cycle, if the transition of the gate 101 occurs before the midpoint of the positive half-cycle of the Q output of flip-flop element 108, and a positive D.C. component if the transition occurs after the midpoint of the positive half-cycle. Flip-flop element 106 and exclusive-OR gate 116 similarly function (waveform i) for transitions at the gate 101 output, during negative half-cycles of the Q output waveform d. Thus, any transitions which produce pulses 101x during the positive half-cycle 101y of local clock waveform (waveform c), tend to charge the filter capacitors towards the negative supply voltage, reducing the junction 30c voltage (waveform j), while any transitions producing pulses 101x during the negative half-cycle 101z of the local clock waveform tend to charge the filter capacitors towards the positive supply voltage and increase the voltage at junction 30c.

Illustratively, waveform h, in the example of FIG. 1c, is negative for a greater period of time than it is positive. In intervals $B_2$, $B_6$ and $B_8$, the positive periods 152a, 156a and 158a and negative periods 152b, 156b and 158b are of equal duration, as waveform c is a symmetrical square waveform. Further, the value during interval $B_3$ negates the value during interval $B_4$. In intervals $B_1$, $B_5$ and $B_7$, the waveform is clearly negative for a longer time than it is positive, e.g. by an amount equal to $2 \times (t_4 - t_3)$ for interval $B_1$. If the pulses 110x were occurring at the desired time, e.g. time $t_4$, then intervals $B_1$, $B_5$ and $B_7$ would also have equal positive and negative time intervals and the phase detector output voltage (waveform j) would be $V_c$, i.e. have zero difference from the "zero" comparison voltage, as desired. If the pulses 101x were occurring at a time after the negative-going transition 101y" of waveform c, i.e. at $t_5$ for example, waveform h would have a net positive charging effect on capacitors 122 and 124. In waveform i, the value during interval $B_1$ cancels the value of the preceeding interval, while the value for interval $B_3$ is zero; intervals $B_4$ and $B_5$ add to zero, as do intervals $B_6$ and $B_7$, $B_8$ and a following interval, etcetera. Only interval $B_2$ has a negative contribution.

It is seen that two flip-flop elements 104 and 106 are necessary for the detector as pulse trains may be received which would produce zero servo action and yet not be phased properly. One of waveforms h or i (illustratively, waveform h here) would not be present and the remaining one of waveforms i or h (waveform i in the illustrative case) would be producing a zero output and yet the clock would clearly not be phased with the data.

It should be noted that the pattern and/or polarity of the transitions producing pulses 101x are of no importance, provided that the pulse 101x-producing transitions are spaced by multiples of the baud rate, e.g. multiples of 1/30th of a second. Thus, the inverting input of comparator 34c receives the waveform j voltage, which is centered around a voltage of magnitude $V_c$ which is the comparator voltage supplied to comparator second input 34b, for operating switching means 12 as previously described hereinabove.

While the present invention has been described with reference to several preferred embodiments thereof, many variations and modifications will now become apparent to those skilled in the art. It is my intent, therefore, to be limited only by the scope of the appending claims, and not by the specific details presented herein.

What is claimed:

1. A method for synchronizing the transition frequency of a local baud clock digital signal of a receiver in a digital communication system, to the exact baud frequency and phase of a received data bit transition stream, comprising the steps of:

(a) generating a first digital signal having a local clock frequency $f_y$ which is a first integer multiple of the nominal baud transition frequency of said received data bit transition stream;

(b) generating a second digital signal having an offset frequency $f_z$ which is less than the first digital signal frequency $f_y$;

(c) adding said second frequency digital signal to said first frequency digital signal to provide a digital signal having a higher local transition frequency $(f_y + f_z)$;

(d) subtracting said second frequency digital signal from said first frequency digital signal to provide a digital signal having a lower local transition frequency $(f_y - f_z)$;

(e) selecting one of the higher and lower local transition frequency signals;

(f) dividing the selected local transition frequency signal by said first integer to obtain said local baud clock digital signal;

(g) comparing the transition frequency of said local baud clock digital signal to the exact baud clock transition frequency of the received data bit transition stream to obtain an error signal; and (h) monitoring the error signal to select the remaining one of the higher and lower local transition frequency signals for division by the first integer to obtain the local baud clock digital signal if the error signal exceeds a predetermined limit.

2. The method of claim 1, wherein step (b) includes the step of selecting the offset frequency $f_z$ to be a second integer multiple of the nominal baud transition frequency of said received data bit transition stream.

3. The method of claim 1, further including the step (i) of selecting the first digital signal for division by said first integer to obtain a local baud clock transition signal having said nominal baud transition frequency when a data bit stream is not received.

4. The method of claim 1, wherein step (f) includes the steps of providing a plurality of local baud clock digital signals each having a transition phase different from the transition phases of the remaining baud clock digital signals; and selecting a local baud clock digital signal of desired transitional phase for comparison to the baud frequency of the received data bit transition stream.

5. The method of claim 4, further including the step of selecting the transition phases of each of the plurality of local baud clock digital signals to have essentially equal transition phase differences therebetween.

6. The method of claim 4, further including the step of selecting the local baud clock digital signal to be one of the local baud clock digital signal transition phases other than the local baud clock digital signal transition phase compared to the received data bit transition stream baud frequency.

7. The method of claim 1, wherein steps (a) and (b) include the steps of setting the first and second integer multiples to be respectively $2^{L_o}$ and $2^{L_1}$ times the baud frequency of the received data bit transition stream, where $L_o$ is an integer greater than another integer $L_1$; and step (f) includes the step of dividing the selected signal by $2^{L_o}$.

8. The method of claim 1, wherein the exact baud frequency is a sub-harmonic of a system-wide frequency.

9. The method of claim 8, wherein the system is a powerline communication system and the system-wide frequency is the powerline frequency.

10. The method of claim 9, wherein the exact baud frequency is the first sub-harmonic of the instantaneous powerline frequency.

11. Apparatus for synchronizing the transition frequency of a local baud clock digital signal of a receiver in a digital communication system, to the exact baud transition frequency and phase of a received data bit transition stream, comprising:

(a) first means for generating first and second digital signals having first and second local transition frequencies offset to be respectively greater than and less than the transition frequency of a local digital signal which is a first integer multiple of the nominal baud transition frequency of said received data bit transition stream;

(b) second means for selecting one of said first and second digital signals;

(c) third means for dividing the digital signal selected by said second means by said first integer to obtain said local baud clock digital signal having a transition frequency either above or below said received data bit stream baud transition frequency;

(d) fourth means for generating an error signal of magnitude responsive to the transition frequency difference between said local clock digital signal and received data bit stream baud transition frequencies; and (e) fifth means for detecting said error signal exceeding a predetermined value to cause said second means to select the remaining one of said first and second digital signals for coupling to said third means to reduce the error signal and synchronize said local clock signal frequency transitions to the exact baud frequency transitions of said received data bit transition stream.

12. The apparatus of claim 11, wherein said first means includes means generating a digital signal having a local transition frequency $f_y$ which is an integer multiple of the nominal baud transition frequency of the received data bit transition stream;

means generating another digital signal having an offset transition frequency $f_z$ less than the local transition frequency $f_y$;

means for digitally adding said offset transition frequency $f_z$ signal to said local transition frequency $f_y$ signal to provide said first local signal at a transition frequency of $(f_y+f_z)$; and means for digitally subtracting said offset transition frequency $f_z$ signal from said local transition frequency $f_y$ signal to provide said second local signal at a transition frequency of $(f_y-f_z)$.

13. The apparatus of claim 12, wherein said offset transition frequency is another integer multiple of said received data bit transition stream band frequency.

14. The apparatus of claim 13, wherein said local transition frequency $f_y$ is a binary multiple $2^Z$ of said offset transition frequency $f_z$; said offset transition frequency generating means being a Z-stage binary frequency divider having an input receiving said local transition frequency $f_y$ signal and an output at which said offset transition signal appears.

15. The apparatus as set forth in claim 14, wherein said local transition frequency $f_y$ is a binary multiple $2^P$ of said received data bit transition stream baud frequency; and said third means is a P-stage binary frequency divider having an input receiving said selected one of said first and second digital signals and an output at which said local baud clock digital signal appears.

16. The apparatus as set forth in claim 12, wherein said transition frequency adding means comprises an exclusive-OR gate having a first input receiving said local transition frequency $f_y$ signal and a second input receiving said offset transition frequency $f_z$ signal, and an output at which a waveform appears having a transition frequency equal to the sum of the local and offset transition frequencies.

17. The apparatus of claim 16, further comprising a flip-flop logic element having a data input receiving said offset transition frequency $f_z$ signal and a clock input receiving a digital signal having a transition frequency which is an integer multiple of said local transition frequency $f_y$, and having an output which is the only connection to said second input of said exclusive-OR gate.

18. The apparatus of claim 12, wherein said transition subtracting means comprises a first flip-flop logic element having a data input continuously receiving an enabling logic level, a clock input receiving the offset transition frequency $f_z$ signal, a reset input and a true Q output;

a second flip-flop logic element having a data D input connected to the true Q output of said first flip-flop logic element, a clock C input, and an inverted Q output connected to the reset R input of said first flip-flop logic element; and a NOR gate having a first input connected to the true Q output of said second flip-flop logic element and a second input connected to said clock C input of said second flip-flop logic element and receiving said local transition frequency signal $f_y$ signal, and an output at which a waveform appears having a transition frequency equal to the difference of the local and offset transition frequencies.

19. The apparatus of claim 11, wherein said local transition frequency $f_y$ is selected to be said integer multiple of said received data bit transition stream baud frequency; and further comprising sixth means for providing said third means with said local transition frequency $f_y$ signal when said received data bit transition stream signal is not present.

20. The apparatus of claim 19, wherein said sixth means includes switch means for selectively coupling either the selected transition frequency output of said second means or said first digital signal to said third means respectively responsive to the presence and absence of said received data bit transition stream.

21. The apparatus of claim 11, wherein said third means includes means for generating a plurality of said local baud clock transition frequency signals each having a transition phase different from the transition phases of the remaining local baud clock transition frequency signals; and means for selecting a desired one of the differently-phased local baud clock transition frequency signals as the local baud clock transition signal for use in said receiver.

22. The apparatus of claim 21, wherein said means for generating said differently-phased plurality of local baud clock transition frequency signals is a Johnson counter.

23. The apparatus of claim 22, wherein said means for selecting the desired one of said plurality of differently-phased local baud clock transition frequency signals includes at least one logic gate.

24. The apparatus of claim 11, wherein said fourth means is a phase detector receiving said local baud clock digital signal at the first input thereof and said received data bit transition stream at a second input thereof and having an output at which said error signal is generated responsive to the phase difference between the transitions of the signals at said first and second inputs.

25. The apparatus of claim 24, further including means for low-pass filtering the signal at the output of said phase detector and providing the low-pass-filtered signal as the error signal to said fifth means.

26. The apparatus of claim 24, wherein said phase detector includes a two-input exclusive-OR gate.

27. The apparatus of claim 24, wherein said phase detector comprises means for providing a uni-polar pulse for each transition of said received data bit stream signal; and means receiving said uni-polar pulses and said local baud clock digital signal for providing said error signal as an analog voltage with a preselected magnitude if each of said uni-polar pulse occurs at a time essentially at a transition of said local baud clock digital signal and with a magnitude which is greater or less than the said preselected magnitude of said uni-polar pulse occurs other than at said local baud clock digital signal transition.

28. The apparatus of claim 27, wherein said analog voltage providing means comprises a first JK-type flip-flop logic element having J and K inputs receiving a substantially constant enabling logic level, a clock C input receiving the local baud clock digital signal and having a true Q output and an inverted Q output changing logic states responsive to transitions of the local baud clock digital signal; first and second flip-flop logic elements each having a first (J) input respectively connected to the true Q and inverted Q̄ outputs of said JK-type flip-flop element; a clock C input receiving uni-polar pulses, a reset R input and a true Q output having logic signal states controlled by the state of the signals at the first J, reset R and clock C inputs; first and second NOR gates each having a first input receiving said local baud clock digital signal, a second input each respectively connected to a respective one of said JK flip-flop element true Q and inverted Q̄ outputs, and an output respectively connected to the reset R input of a respective one of the first and second flip-flop elements; first and second exclusive-OR gates each having first and second inputs respectively connected to the true Q output and the first J input of a respective one of the first and second flip-flop elements, and an output; and a lowpass filter including first and second resistance elements connected in series between the outputs of said first and second exclusive-OR gates and first and second filter capacitances connected between a junction formed between said first and second resistance elements and opposites ones of opposed polarity operating potentials of substantially identical magnitudes; said analog voltage error signal being provided at said junction.

29. The apparatus of claim 11, wherein said fifth means includes a voltage comparator having a first input receiving said error signal, a second input receiving a substantially constant comparison voltage and an output enabling said second means to select said one and said remaining one, respectively, of said first and second digital signals if the magnitude of the voltage at the voltage comparator first input is respectively greater than and less than said comparison voltage magnitude at said second voltage comparator input.

* * * * *